United States Patent [19]

Sebald et al.

[11] Patent Number: 5,171,656
[45] Date of Patent: Dec. 15, 1992

[54] PHOTOSENSITIVE COMPOSITION

[75] Inventors: Michael Sebald, Hessdorf-Hannberg; Juergen Beck, Erlangen; Rainer Leuschner, Grossenseebach; Recai Sezi, Roettenbach; Hans J. Bestmann, Erlangen, all of Fed. Rep. of Germany

[73] Assignee: Siemens Aktiengesellschaft, Berlin & Munich, Fed. Rep. of Germany

[21] Appl. No.: 556,014

[22] Filed: Jul. 20, 1990

[30] Foreign Application Priority Data

Jul. 26, 1989 [DE] Fed. Rep. of Germany ....... 3924784

[51] Int. Cl.$^5$ .................. G03C 1/52; C07C 245/12
[52] U.S. Cl. .................... 430/189; 430/170; 430/192; 534/560; 534/564
[58] Field of Search .......... 430/189, 193, 170, 192; 534/556, 560, 564

[56] References Cited

U.S. PATENT DOCUMENTS

| 4,339,522 | 7/1982 | Balanson et al. | 430/192 |
| 4,622,283 | 11/1986 | Gray | 430/191 |
| 4,624,908 | 11/1986 | Schwartzkopf | 430/192 |
| 4,735,885 | 4/1988 | Hopf et al. | 430/192 |

OTHER PUBLICATIONS

Grant, B., et al. *Deep UV Photoresists I. Meldrum's Diazo Sensitizer*, "IEEE Trans. Electron Devices", vol. ED-28 (1981), pp. 1300–1305.
Endo, M., et al. *Excimer Laser Lithography Using Contrast Enhancing Material*, "J. Vac. Sci. Technol. B", vol. 6 (1988), pp. 559–563.
Willson, C. G., et al. *New Diazoketone Dissolution Inhibitors For Deep UV Photolithography*, "Proc. of SPI" vol. 771 (1987), pp. 2–10.
Baker J., et al. *New 2-diazocyclohexane-1, 3-dione Photoreactive Compounds for Deep UV Lithography*, "Proc. of SPIE", vol. 920 (1988), pp. 51–58.
Tani, Y., et al. *A New Positive Resist for KrF Excimer Laser Lithography*, "SPIE's 1989, Symposium on Microlithography", Feb. 26–Mar. 3, 1989, Fairmont Hotel, San Jose, Calif., USA.
Von Hartmut Steppan, et al. "Angewandt Chemie", Bd. 94 (1982) pp. 471–485.
DeForest, W. S. "Photoresist, Materials and Processes", pp. 57–58, McGraw-Hill, New York, 1975.
K. Schank, R. Blattner, vol. 114, Chem. Ber. pp. 1958–1962 (1981).

*Primary Examiner*—Charles L. Bowers, Jr.
*Assistant Examiner*—Mark F. Huff
*Attorney, Agent, or Firm*—Kenyon & Kenyon

[57] ABSTRACT

Photosensitive compositions comprising a polymer and a photoactive constituent, which are able to be developed with aqueous, alkaline agents exhibit good bleaching properties in the DUV range, whereby the photoactive constituent has good solubility-inhibiting properties and does not evaporate during the drying process, when the photoactive constituent comprises diazo tetronic acid or a diazo tetronic acid derivative of the following structure:

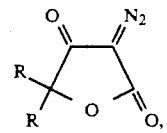

where the residues R are the same or different and signify H, alkyl, cycloalkyl, aryl or a silicon-containing residue.

7 Claims, No Drawings

PHOTOSENSITIVE COMPOSITION

BACKGROUND OF THE INVENTION

1. Field of the Invention

The invention relates to a photosensitive composition comprising a polymer and a photoactive constituent, as well as to a method of producing relief structure elements from this type of a photosensitive compound.

2. Description of Related Art

Structural elements in the μm- and sub μm range, which are photolithographically produced from photosensitive compounds, i.e. photoresists, play a key role in manufacturing highly integrated circuits. Namely, these types of structural elements generally serve as photomasks during a series of processing steps, such as ion implantation, doping, wet and dry etching, which are performed during the production of these components.

While the thermal and mechanical properties as well as the etch resistance of the relief structural elements can be influenced by the selection of the resin base—i.e. of the polymer—of the resist, the photostructurability is predominantly determined by the photoactive constituent. However, photoactive constituent and polymer must thereby match insofar as that, for example, segregation of the photosensitive compound cannot occur and that the exposed resist can be developed. Moreover, the photoactive constituent must satisfy a series of requirements such as free solubility, storage stability, ability to be developed with atoxic, highly aqueous—i.e., environmentally safe—developers, and high sensitivity—i.e., short exposure time—in conjunction with a bleaching of the photoactive constituent. Furthermore, the adhesion of the polymer to the substrate may not be impaired and an accurate transfer of the pattern, in conjunction with good resolution, must be guaranteed.

Either negative resists or positive resists can be used to produce fine structural elements (c.f. e.g.: "Angew. Chem.", Vol. 94 (1982), pp 471 to 485). Negative resists, in which the structuring principle is generally based on a cross-linkage of the exposed parts, to which a reduction of solubility is connected, exhibit a lower resolution, which is caused by swelling, in comparison to positive resists, and are usually developed with environmentally and economically unsound organic developers. In the case of positive resists, where the solubility in the developer is increased by means of the radiative action, the difference in solubility between the exposed and unexposed parts is usually brought about by a photochemically induced change of the polarity, whereby an aqueous alkaline developing process without swelling is made possible.

Commercially sold positive resists are generally based on novolak resins as an alkali-soluble base polymer and sulfonic esters of diazo naphthoquinones as a photoactive constituent (Ibid., p. 481). These types of resists satisfy the requirements regarding good bleaching properties, high sensitivity and high resolution down to the half-micron range during exposure in near UV, i.e., at exposure wavelengths of 436 or 365 nm, for example. In accordance with the increasing integration densities in electronic components, however, a resolution in the sub μm range is required. This maximum resolution can be realized according to the formula $CD = k \lambda/NA$ —where CD equals the smallest imaged structural element; $\lambda$ equals the wavelength of the light used for the lithographic process; NA equals the numerical aperture which is dependent on the optical system; and k equals a process-specific factor—by reducing the exposure wavelength, e.g. to 248 nm (DUV, KrF-Excimer laser). However, the aforesaid commercial resist systems cannot be used at this wavelength due to the insufficient bleaching properties of the photoactive constituents and the high absorption of the novolak base resins: namely, they have residual absorption values of $>0.3$ $\mu m^{-1}$, whereas residual absorption values $<0.1$ $\mu m^{-1}$ are required. Thus, suitable DUV-transparent base polymers and completely bleaching photoactive constituents which have the aforesaid profile of requirements are necessary to realize highest resolution, positively operating DUV-resists (DUV=Deep UV), in particular for an exposure at 248 nm.

Various 2-diazo-1,3-diketones have already been proposed as photoactive constituents (PAC) for positive DUV photoresists, which—analogous to the diazo naphthoquinones for the NUV-range (NUV=near UV-)—are converted into corresponding carboxylic acids during DUV exposure via the Wolff-rearrangement process and the reaction of the thereby formed ketene with water, thereby making the resist able to be developed with alkalis in the exposed regions. Thus, the use of diazomeldrumic acid (2,2-dimethyl-5-diazo-1,3-dioxane-4,6-dione) and derivatives thereof is described as a PAC in mixtures using novolaks as a DUV-resist (c.f. U.S. Pat. No. 4,339,522 as well as "IEEE Trans. Electron Devices", Vol. ED-28 (1981), pp 1300–1305, and "J. Vac. Sci. Technol. B", Vol. 6 (1988), pp 559 to 563). Although these compounds exhibit very good bleaching properties in the DUV range in conjunction with high contrast and relatively high sensitivity (50 mJ/cm$^2$), the resolution is limited to approximately 2 μm due to the evaporation of the diazomeldrumic acid from the resist layer during the drying process and due to the poor solubility-inhibiting properties of this compound. Furthermore, no non-volatile derivatives of diazomeldrumic acid could be found with sufficient solubility in the usual resist solvents.

It is known from the teachings of U.S. Pat. Nos. 4,622,283 and 4,624,908 to use diazodimedone (2-diazo-5,5-dimethyl cyclohexane-1,3 dione) or derivatives thereof and other 2-diazo-1,3-diketones such as diazocyclopentandione as a DUV-PAC in mixtures with novolaks, polyvinylphenol and methacrylate/methacrylic acid copolymers (also c.f.: "Proc. of SPIE", Vol. 920 (1988), pp 51 to 58). Although, in contrast to diazomeldrumic acid and also to diazodimedone itself, the diazodimedone derivatives do not evaporate during the drying process and are soluble in resist solvents; just like diazodimedone and diazomeldrumic acid, they also exhibit excellent bleaching properties in the DUV range. However, due to the high dark film loss rates of the selected resist systems (14 to 42% of the original film thickness), only a resolution of 0.75 μm at simultaneously sloped resist side-walls can be attained with these derivatives. Furthermore, these resist systems are relatively insensitive (100 to 150 mJ/cm$^2$).

Additional non-volatile diazoketones with good DUV bleaching properties are diazotetramic acid (3-diazopyrrolidine-2,4-dione) and diazo homotetramic acid (3-diazopiperidine-2,4-dione) as well as 1,2-diphenyl-4-diazopyrazolidine-3,5-dione (c.f.: "Proc. of SPIE", Vol. 771 (1987), pp 2 to 10). These compounds serve as DUV-PAC's in resist formulas with novolak, styrene/maleinimide copolymers, polyglutarimide and polyvinylphenol. Also, structural elements with very sloped side-walls, which can perhaps be used in a three-layer system but which are unsuitable for sub-half micron lithography, are obtained with these systems due to the low contrast. Thus, 1-μm-line/space patterns with very sloped side-walls are obtained after a polychromatic DUV exposure, and greatly overexposed 1.5-μm-line/space patterns with somewhat steeper side-walls are obtained after exposure to a KrF-Excimer laser.

In addition, a system consisting of a chlorosulfonyl-phenyl-diazo cycloheptane dione derivative as a PAC and a styrene/maleic semi-ester copolymer as a base resin were already reported ("SPIE's 1989 Symposium on Microlithography", Feb. 26, 1989 to Mar. 3, 1989, San Jose, Calif., USA: Symposium Minutes, p 34). However, this system might not be able to be used in maximum resolution silicon technology both due to the corrosiveness of the chlorosulfonyl groups as well as the related storage instability under the influence of atmospheric humidity.

It is an object of the present invention to provide positively operating DUV photoresists, in particular for KrF-Excimer laser exposures at 248 nm, which, in the form of photosensitive compositions consisting of a polymer and a photoactive constituent, are able to be developed with aqueous, alkaline agents, where the photoactive constituents have good bleaching properties in the DUV range in conjunction with good solubility-inhibiting properties and where they do not evaporate from the resist layer during the drying process.

SUMMARY OF THE INVENTION

The invention provides a photosensitive composition comprising a polymer and a photoactive constituent, wherein the photoactive constituent comprises diazo tetronic acid or a diazo tetronic acid derivative of the following structure:

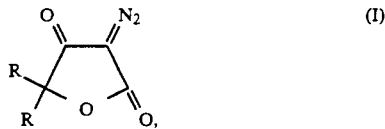

where the residues R are the same or different and have the following definition:

R=H, alkyl, preferably with 1 to 5 C-atoms, cycloalkyl, aryl or a silicon-containing residue;

or at least one of the residues R comprises an aliphatic or aromatic group which carries at least one additional diazo tetronic acid grouping;

or one of the residues R stands for a single bond by means of which the diazo tetronic acid grouping is bonded directly to the polymer;

or one of the residues R comprises an alkylene-, an arylene or a bivalent, silicon-containing residue which is bonded to the polymer.

DETAILED DESCRIPTION OF THE INVENTION

The photoresist according to the invention contains 3-diazo tetronic acid or derivatives of this compound substituted in the 5-position (tetronic acid is 2,4(3H,5H)-furandione) as the PAC. Mixtures of these compounds can also be used. These types of photoactive constituents have excellent bleaching properties in the DUV range and thus, in a mixture with DUV-transparent base polymers, make possible a maximum utilization of the DUV exposure device, e.g. of a KrF-Excimer laser stepper. After exposure, the residual absorption of the photosensitive composition according to the invention—i.e., the DUV-resist—thereby lies in the range of 0.08 to -0.06 μm[31 1], thus allowing the illuminating light to reach even the lower lying regions of the resist layer undiminished. This property becomes noticeable in a high contrast of this resist and in a high edge steepness of the resist structural elements produced from it.

A further advantage of photoactive constituents of the said type lies in their excellent solubility-inhibiting properties and in the rapid and complete photochemical rearrangement into hydrophilic carboxylic acid compounds (base: oxetane-2-one-3-carboxylic acid) during exposure:

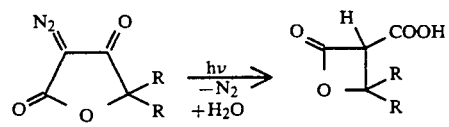

Thus, it can be explained that unexposed resist layers consisting of the photosensitive compositions according to the invention have as good as no dark film loss during the aqueous alkaline development process, while the exposed places—at a high level of sensitivity—are quickly developed. Highly sensitive resists require only a low dosage of light for structuring, i.e. a short exposure time, and thus make possible a reduction of the operating times on the cost intensive exposure apparatuses.

Further advantages of the diazo tetronic acid and its derivatives when being used as photoactive constituents are free solubility in the customary resist solvents, good compatibility with the base polymers and good storage stability in the resist mixtures. These compounds distinguish themselves further by a high temperature stability (>120° C.) and by nonvolatility during the resist drying process. Thus, a high lithographic reproduceability is guaranteed even in the case of fluctuations of the drying conditions such as temperature and pressure.

The selection of suitable photoactive constituents basically is not subject to any limitations, since the advantages described above arise mainly from the structure of the diazo tetronic acid. The residues R (c.f. formula I) can therefore be of an aliphatic and/or aromatic nature, and they can also contain etch-resistant elements, in particular silicon, for an increased etch resistance in an oxygen plasma. The photoactive constituent, however, is adjusted to the respective base polymer.

Preferably polymers with carboxylic anhydride groups are used as base polymers in the photosensitive compositions according to the invention; however, in addition, other DUV-transparent polymers such as polyvinylphenol, styrene/maleinimide copolymers and polyglutarimide also come into consideration. The DUV-transparent, anhydride-containing polymers advantageously have the following structure:

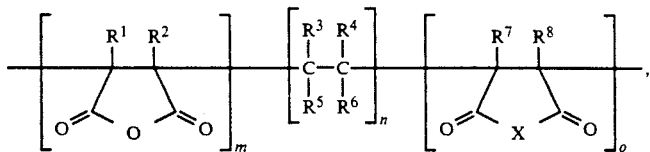

where m, n and o signify whole numbers; and n and/or o can assume the value 0; and the structural fragment with the index m comprises a portion from 10 to 55% of the whole structure; X is =O, S or NR', where R' stands for H, alkyl, vinyl, allyl, acryl or aryl; and the residues $R^1$ to $R^8$ signify hydrogen, alkyl, aryl, halogen, halogen-substituted alkyl or aryl or an olefinic unsaturated residue; and, moreover, one of the residues $R^3$ to $R^6$ can have the following significance:

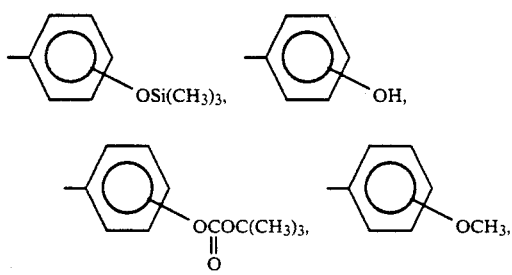

—COOH, —COOR, —CH$_2$Si(CH$_3$)$_3$, —Si(CH$_3$)$_3$ and

—Si(OCH$_3$)$_3$.

Furthermore, the base polymer can have fragments of the following structure in the chain as regularly recurring units:

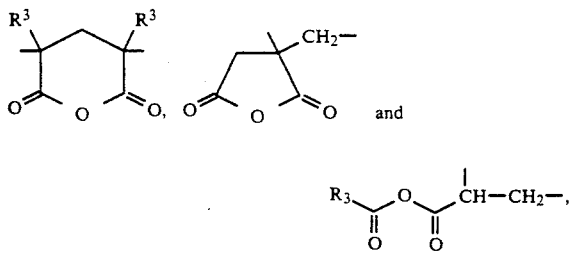

where $R^3$ stands for the aforesaid groups. Furthermore, the base polymer can be derived from anhydride monomers which have at least one of the following structures:

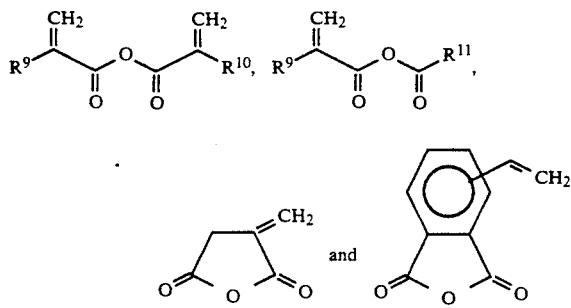

where $R^9$ and $R^{10}$ signify H or alkyl and $R^{11}$ stands for an alkyl or aryl residue.

The photosensitive composition according to the invention preferably contains 1 to 50 wt. % of photoactive constituents on the base of diazo tetronic acid. The concentration of PAC advantageously amounts to 15 to 25 wt. %. For the case that the diazo tetronic acid grouping is bonded to the polymer, directly or via a bridge, this polymer can act simultaneously as a base polymer and as a PAC, whereby the admixture of an additional photoactive constituent can be dispensed with.

A further advantage of the photoactive constituent according to the invention lies in the easy accessibility. Namely, the preparation takes place by means of a simple diazotization of tetronic acid or one of its derivatives, e.g. by means of tosylazide. The synthesis of tetronic acid itself or of tetronic acid derivatives is described in the documentation (c.f. e.g.: "Syn. Commun." Vol. 11 (1981), pp 385 to 390, or "Spectrochim. Acta", Vol. 40A (1984), pp 1007 to 1009).

To make the relief structure elements, a photosensitive composition according to the invention is applied to a substrate in the form of a layer or film and is exposed to actinic light through a photomask or is irradiated by guiding a corresponding beam of light. The exposed or irradiated layer or film parts are subsequently dissolved out or drawn off, and the thus obtained structural elements are then dried at an elevated temperature, and cured, if indicated.

The photosensitive composition, i.e. the photoresist, can be advantageously applied to the substrate as a solution in an organic solvent. Preferably methoxypropylacetate or N-methylpyrrolidone is thereby used as a solvent. In addition, however, other organic solvents having similar properties, such as ethoxy ethyl acetate, butylacetate and cyclohexanone as well as mixtures of the said solvents, can also be used.

In the method according to the invention, an adhesive agent and/or a wetting agent can be used advantageously. Adhesive or wetting agents can thereby be added to the photoresist solution; but they can also be applied to the substrate before coating it with the photoresist. The photoresist solution is preferably applied to the substrate by means of centrifugal or electrostatic spraying techniques. In addition, however, other coating methods such as dipping, brushing and rolling can also be used. The substrate preferably consists of glass, of metal, particularly aluminum, of plastic or of a semiconducting material.

The invention shall be more closely explained in light of exemplified embodiments.

EXAMPLE 1

Preparation of Diazo Tetronic Acid 15 g tetronic acid are dissolved in 150 ml ethanol and are mixed under refrigeration with 15.2 g triethylamine. The mixture is cooled down to −10° C., and then an equimolar amount of tosylazide is added. The mixture is subsequently stirred for 1 hour in the cryogenic bath and is then stored for 24 hours in a refrigerated compartment. The precipitated product is filtered off and is recrystallized from ethanol. Light pink tinted crystals with a melting point of 90° C. are obtained (yield: 53%).

EXAMPLE 2

Preparation of a Resist Solution

A ready-to-use photoresist solution is prepared by dissolving 8 parts by weight of an alternating copolymer consisting of maleic anhydride and allyltrimethyl silane and 2 parts by weight diazo tetronic acid in 50 parts by weight 2-methoxy-1-propylacetate.

EXAMPLE 3

Determining Contrast, Sensitivity and Dark Film Loss

A 1 μm thick resist layer is applied to a substrate by centrifugally spinning the resist solution which was prepared according to example 2 and by subsequently drying it at 110° C. on a hotplate (duration: 60 sec.). This layer is exposed to a light with the wavelength 249.7 nm through a neutral wedge photomask (50 mJ/cm$^2$) and is subsequently developed for 75 seconds in a conventional developer (AZ 400K, thinned with 5 parts by weight water and mixed with 0.7 parts by weight ammonia) and is dried at 110° C. for 60 seconds on the hotplate. By measuring out the layer thicknesses of the individual neutral wedge gradations and their outlining versus a logarithmic dosage scale, a contrast of −5.6 is determined at a sensitivity of 22 mJ/cm$^2$. The film loss of the unexposed resist regions under these conditions amounts to 4 nm.

EXAMPLE 4

Structuring the Resist Layer

A resist layer produced according to example 3 is contact exposed (50 mJ/cm$^2$) to light with the wavelength 249.7 nm through a photomask which has structural elements from 2 to 0.5 μm and is then developed and dried as described in example 3. Scanning electron microscopic pictures show relief structural elements with a resolution up to 0.5 μm that have steep sidewalls.

What is claimed is:

1. A photosensitive composition comprising a polymer and a photoactive constituent, wherein the photoactive constituent comprises diazo tetronic acid or a diazo tetronic acid derivative of the following structure:

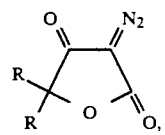

where the residues R are the same or different and have the following significance:

R=H, Alkyl, cycloalkyl, aryl or a silicon-containing residue;

or at least one of the residues R comprises an aliphatic or aromatic group which carries at least one additional diazo tetronic acid grouping;

or one of the residues R stands for a single bond through which the diazo tetronic acid grouping is directly bonded to the polymer;

or one of the residues R comprises an alkylene-, an arlyene or a bivalent, silicon-containing residue which is bonded to the polymer.

2. The photosensitive composition according to claim 1 wherein said composition contains 1 to 50 wt. % of photoactive constituents.

3. The photosensitive composition according to claim 2 wherein said composition contains 15 to 25 wt. % of photoactive constituents.

4. The photosensitive composition according to claim 1 wherein said polymer has carboxylic anhydride groups.

5. The photosensitive composition according to claim 2 wherein said polymer has carboxylic anhydride groups.

6. The photosensitive composition according to claim 3 wherein said polymer has carboxylic anhydride groups.

7. The photosensitive composition according to claim 4, wherein said polymer has the following structure:

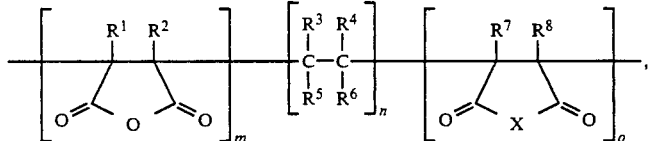

where m, n and o signify whole numbers; and n and/or o can assume the value 0; and the structural fragment with the index m comprises a portion from 10 to 55% of the whole structure; X is =O, S or NR', where R' stands for H, alkyl, vinyl, allyl, acryl or aryl; and the residues $R^1$ to $R^8$ signify hydrogen, alkyl, aryl, halogen, halogen-substituted alkyl or aryl or an olefinic unsaturated residue; and, moreover, one of the residues $R^3$ to $R^6$ can have the following significance:

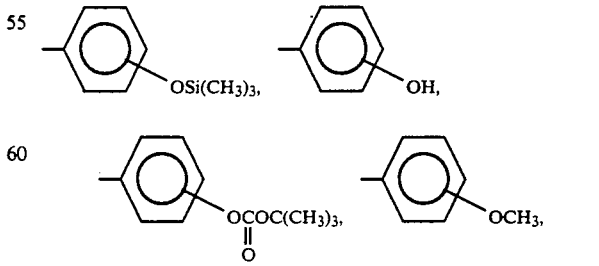

—COOH, —COOR, —CH$_2$Si(CH$_3$)$_3$, —Si(CH$_3$)$_3$ and

—Si(OCH$_3$)$_3$.

* * * * *